(12) United States Patent
Schwarz

(10) Patent No.: US 6,222,123 B1
(45) Date of Patent: Apr. 24, 2001

(54) LOW COST ERROR PROOFING CAP ASSEMBLY

(75) Inventor: Dwight Lance Schwarz, Kokomo, IN (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 09/447,720

(22) Filed: Nov. 23, 1999

(51) Int. Cl.[7] .................................................. H01R 13/46
(52) U.S. Cl. ........................................................ 174/60
(58) Field of Search ................................ 174/59, 60, 67, 174/659, 51, 152 R, 152 G, 153 G; 248/56; 16/2.1, 2.2; 439/137–140, 145, 93, 113

(56) References Cited

U.S. PATENT DOCUMENTS 5,488,198 * 1/1996 Kramer .................................. 174/48
5,806,139 * 9/1998 Anderson et al. ...................... 16/2.1

* cited by examiner

Primary Examiner—Dean A. Reichard
Assistant Examiner—Angel R. Estrada
(74) Attorney, Agent, or Firm—Jimmy L. Funke

(57) ABSTRACT

An error proofing cap assembly which has an annular ring for attaching an electronic module to a mounting. The error proofing cap assembly protects a pre-attached fastener of the electronic module prior to fastening the electronic module to a mounting and serves to insure that an electronic module is properly seated on a mounting before it can be fastened. The error proofing cap assembly remains attached to the electronic module prior to and after fastening to a mounting through its annular ring, the annular ring being engaged to a portion of a pre-attached fastener of the electronic module.

18 Claims, 2 Drawing Sheets

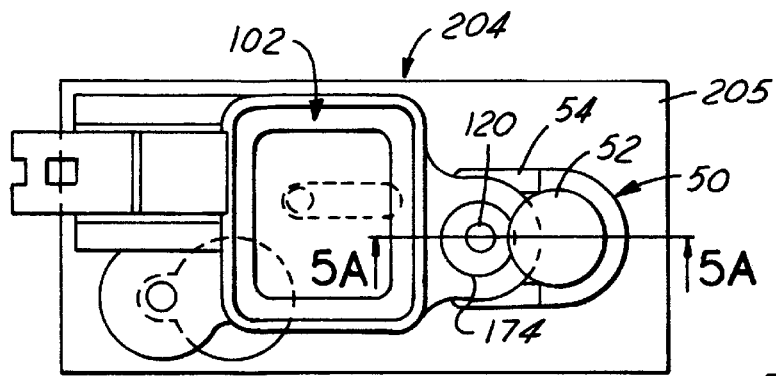
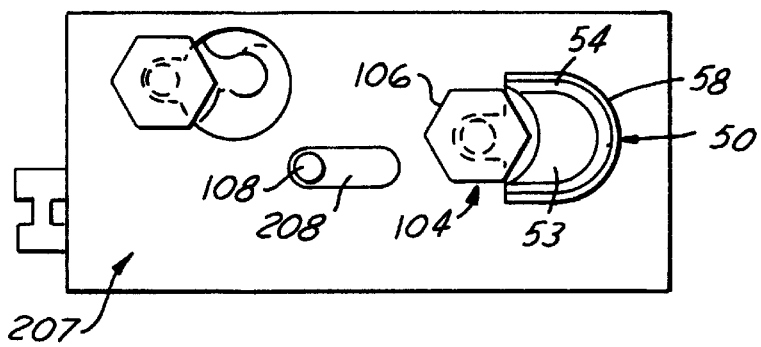
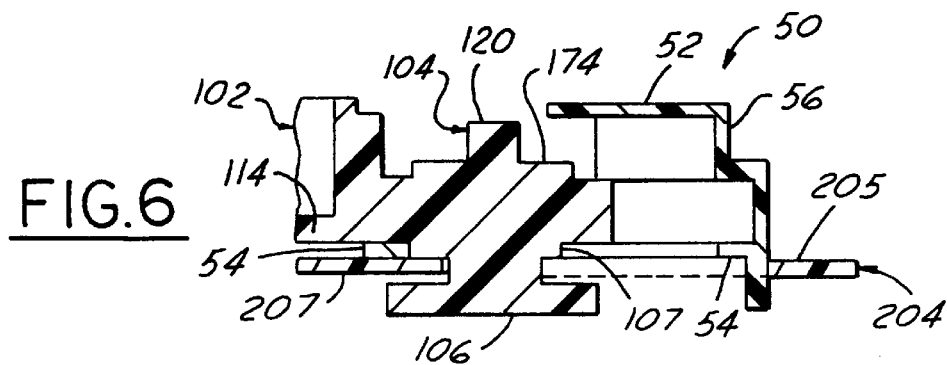
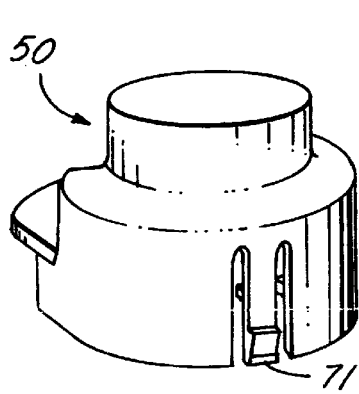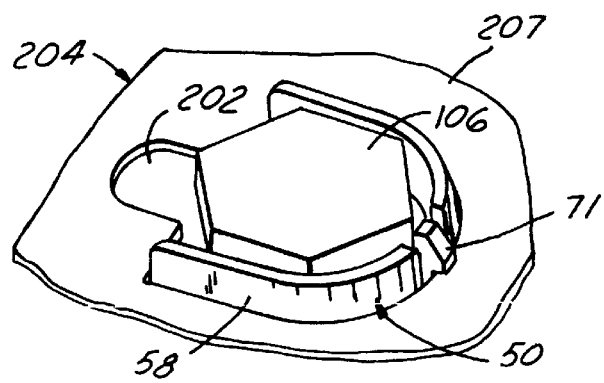

LOW COST ERROR PROOFING CAP ASSEMBLY

TECHNICAL FIELD

The present invention relates generally to error proofing cap assemblies and a method for utilizing same. More specifically, the present invention relates to an error proofing cap assembly for protecting an electronic assembly prior to installation and for assisting in the installation of an electronic module on a mounting.

BACKGROUND OF THE INVENTION

Error proofing cap assemblies are commonly used on electronic modules such as those used in vehicles. These cap assemblies are used to insure that the electronic modules, and specifically fasteners positioned thereon, are not damaged during shipping. These cap assemblies also insure that the electronic modules are properly engaged to a supporting structure before the electronic modules are fastened during the assembly process.

With these current cap assemblies, a plastic cap is attached to an electronic module prior to its installation onto a supporting structure, such as those used in vehicles. In one current cap assembly, the cap is molded and has two protruding arms that attach the cap to the electronic module. The protruding arms are each snapped into a side recess that is integrally formed on the electronic module. The communication of the protruding arms with the recesses allows the cap assembly to be slid between a fastener engaging position and a fastener unengaging position.

In the fastener engaging position, this prior cap assembly covers a pre-attached fastener, which has a head at one end and a "torx"™-type tip on an opposing threaded end. The electronic module is then seated on the mounting, where the error proofing cap assembly is located in a keyhole slot on the mounting so it can be moved between the fastener engaging position and the fastener unengaging position. When the electronic module is fully seated and in the fastener unengaging position, the head of the pre-attached fastener is fully exposed so that a socket can fit thereon for tightening. With this configuration, the electronic module will not be attached while only partially engaged into the keyhole slot. Another function of the cap assembly is to prevent removal thereof during installation of the electronic module, such as on an assembly line.

One drawback to these prior error proofing cap assembly designs is their complexity. Additionally, the designs that contain two protruding arms increase the cost of molding the part by increasing both the cost of making the mold itself and molding the part. The additional cost in molding the part correspondingly increases the cost per vehicle.

Another drawback of these prior error proofing cap assembly designs is that the protruding arms that hold the error proofing cap assembly in place are prone to breakage during manufacture and installation. This too can increase the cost per vehicle as well as resulting in dissociation of the cap assembly with the electronic module.

A further drawback of these current designs is that the electronic modules must be molded with side recesses to accept the protruding arms from the present cap assembly. This also increases the cost of manufacture of the module and further increases the cost per vehicle.

SUMMARY OF THE INVENTION

It is, therefore, one object of the present invention to provide an error proofing cap assembly that is less expensive to manufacture through the utilization of less material and simpler fabricating equipment.

In accordance with the objects of the present invention, an error proofing cap assembly for protecting a pre-attached fastener on an electronic module and assisting in the installation of the electronic module is provided. The error proofing cap assembly comprises a top portion for protecting an upper portion of the pre-attached fastener. The error proofing cap assembly also contains an annular ring for engaging the electronic module and the pre-attached fastener, where the annular ring has an opening that defines an inner periphery of the annular ring. The error proofing cap assembly also contains a ledge extending between the top portion and the annular ring, where the ledge can attach to a top mounting foot on the electronic module. The error proofing cap also comprises at least one flange extending downward from the annular for engaging with a keyhole slot formed on a mounting.

Other features and advantages of the present invention will become apparent from the following detailed description that should be read in conjunction with the accompanying drawings.

BRIEF DESCRIPTION OF THE DRAWINGS

FIG. 5 is a top view of an error proofing assembly cap in a fastener unengaging position on an electronic module and mated with the mounting according to a preferred embodiment of the invention;

FIG. 5A is a bottom view of an error proofing assembly cap in a fastener unengaging position on an electronic module and mated with the mounting according to a preferred embodiment of the invention;

FIG. 6 is a cross-sectional view of an error proofing assembly cap in a fastener unengaging position on an electronic module and mated with a mounting according to a preferred embodiment of the invention.

FIG. 7A is a perspective view of an error proofing cap assembly according to a preferred embodiment of the present invention; and FIG. 7B is a bottom view of an error proofing assembly cap attached to a mounting according to a preferred embodiment of the present invention.

DESCRIPTION OF A PREFERRED EMBODIMENT

Figure 1:
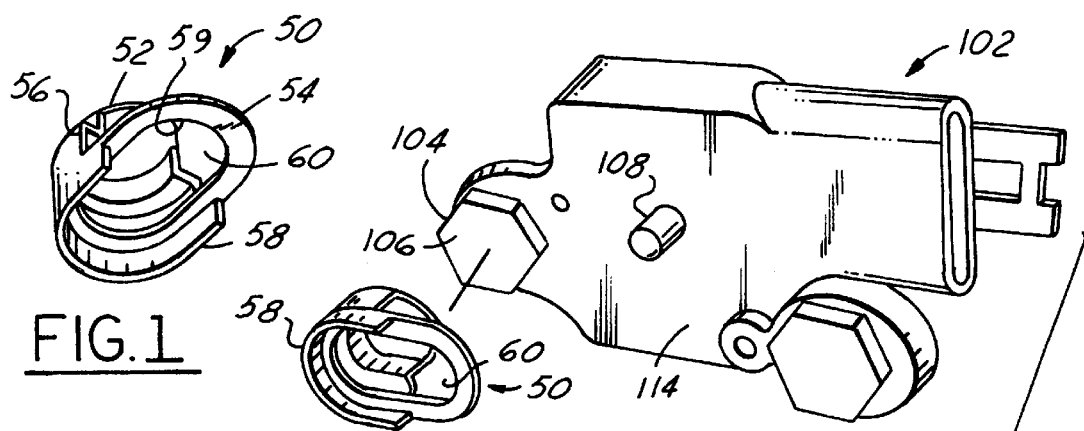
FIG. 1 is a perspective view of an error proofing cap assembly according to a preferred embodiment of the present invention.

Referring now to the drawings, the same reference numerals are used to identify the same components in the various views. Although the invention will be described and illustrated in terms of an electronic assembly, it will be appreciated that this invention may be used for various systems in which an error proofing cap assembly may be required, including, for example on a vehicle or other article of manufacture. The electronic assembly is preferably for use in side air bag control systems for automobiles but may be used in other applications.

FIG. 1 shows the error proofing cap assembly 50. The error proofing cap assembly 50 has a top portion 52, an annular ring 54, a ledge 56 extending from the top portion 52 to the annular ring 54, and at least one flange 58 extending generally downward from the annular ring 54. The ledge 56 only connects a portion of the top portion 52 with the annular ring 54 so that an annular ring opening 60 can be formed. The annular ring 54 has an inner periphery 59 that defines the annular ring opening 60.

Figure 2:
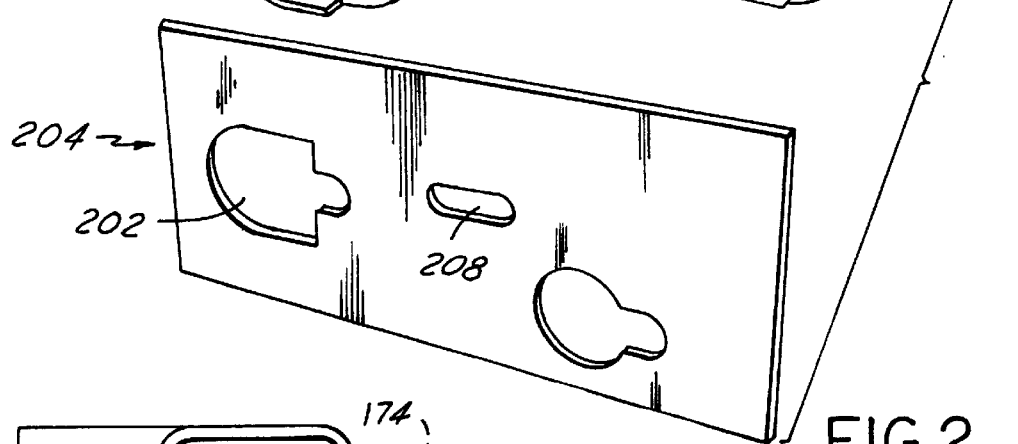
FIG. 2 is a exploded view of an electronic module, an error proofing assembly cap, and an associated mounting according to a preferred embodiment of the present invention.

FIG. 2 is an exploded view of all of the components of the present invention. In FIG. 2, the error proofing cap assembly 50 is disposed between an electronic module 102 and a mounting 204. The electronic module 102 includes a pre-attached fastener 104 having a large end 106, a top mounting foot 174 (shown in FIGS. 3 and 4), and a bottom surface 114. The bottom surface 114 of the electronic module 102 has a guide prong 108 formed thereon. The mounting 204 includes a keyhole slot 202 and a guide prong channel 208 formed thereon.

The error proofing cap assembly 50 is attached to the electronic module 102 by attaching the pre-attached fastener 104 through the opening 60 of the annular ring 54 such that the annular ring 54 is disposed between the large end 106 of the pre-attached fastener 104 and the bottom surface 114 of the electronic module 102. The error proofing cap assembly 50 and electronic module 102 can then be seated to the mounting 204 by engaging the at least one flange 58 within the keyhole slot 202 such that the guide prong 108 is engaged within the guide prong channel 208.

Figure 3:
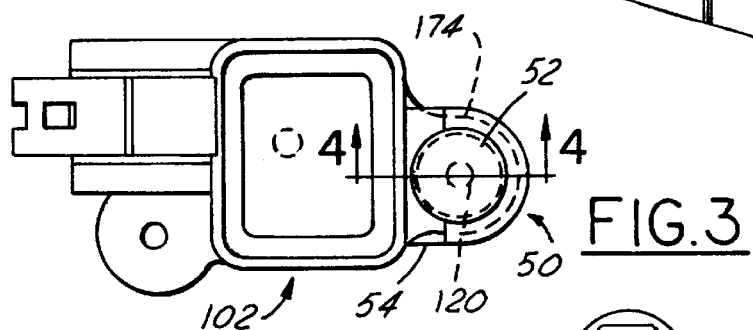
FIG. 3 is a top view of an error proofing assembly cap in a fastener engaging position on an electronic module according to a preferred embodiment of the invention.
Figure 3A:
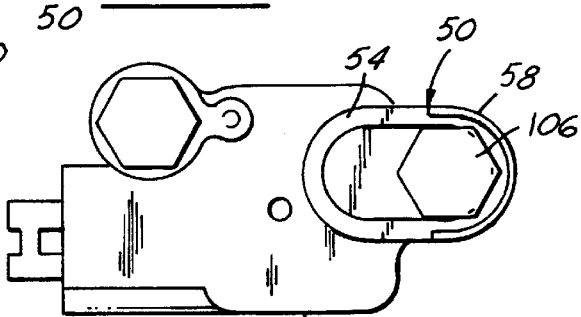
FIG. 3A is a bottom view of an error proofing assembly cap assembly in a fastener engaging position on an electronic module according to a preferred embodiment of the invention.
Figure 4:
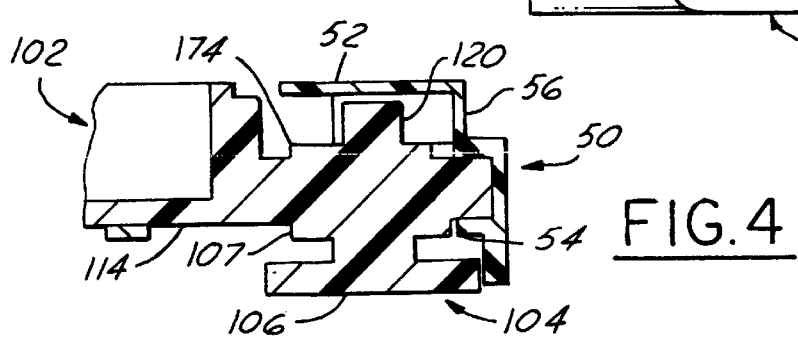
FIG. 4 is a cross-sectional view of an error proofing cap assembly in a fastener engaging position on an electronic module according to a preferred embodiment of the invention.

FIGS. 3, 3A and 4 show a top view, a bottom view, and a crosssectional view of a preferred embodiment of the error proofing cap assembly 50 attached to the electronic module 102 in a fastener engaging position. In FIG. 3, the top portion 52 of the error proofing cap assembly 50 is shown covering the pre-attached fastener 104 and the top mounting foot 174. The annular ring 54 is located at a position below the electronic module 102.

In FIG. 3A, the at least one flange 58 of the error proofing cap assembly 50 is shown closely coupled to the large end 106 of the pre-attached fastener 104 when the error proofing cap assembly 50 is in its engaged position. In this position, the large end 106 of the pre-attached fastener 104 is positioned within the opening 60 of the annular ring 54. Preferably the width of the large end 106 of the pre-attached fastener 104 is wider than the width of the opening 60 of the annular ring 54 in order to prevent the error proofing cap assembly 50 from being easily removed from the electronic module 102.

In FIG. 4, the ledge 56 of the error proofing cap assembly 50 has expanded and mated to the top mounting foot 174 of the electronic module 102 after the ledge 56 contacted the top mounting foot 174. The ledge is preferably mated by snapping but can be mated by other known methods. In this fastener engaging position, the top portion 52 of the error proofing cap assembly 50 is located directly above the head 120 of the pre-attached fastener 104 and functions to protect the head 120 and the electronic module 102 during manufacture and shipping. The annular ring 54 is engaged with the bottom surface 114 of the electronic module 102 and is located above the large end 106 of the pre-attached fastener 104. The thickness of the annular ring 54 is less than the thickness of a shelf 107 of the pre-attached fastener 104 so that when the pre-attached fastener 104 is tightened to the electronic module 102, the mounting 204 (shown in FIGS. 5, 5A, 6 and 7B) contacts the shelf 107, not the annular ring 54. This will prevent creep over time and maintain the torque on the tightened pre-attached fastener 104.

FIGS. 5, 5A and 6 show a top view, a bottom view, and a cross-sectional view of a preferred embodiment of the error proofing assembly cap 50 attached to the electronic module 102 and attached to the mounting 204 in a fastener unengaging position. In FIG. 5, the electronic module 102 has been placed onto the mounting 204 and the error proofing cap assembly 50 has been moved to the fastener unengaging position from the fastener engaging position, thereby exposing the head 120 of the pre-attached fastener 104 and the top mounting foot 174 of the electronic module 102. The head 120 is now available for fastening to the mounting 204.

FIG. 5A shows the at least one flange 58 of the error proofing cap assembly 50 is engaged within the keyhole slot 202 of the mounting 204 and the guide prong 108 is engaged within the guide prong channel 208. In this view, an inner surface 53 of the top portion 52 and a portion of the annular ring 54 of the error proofing cap assembly 50 are exposed through the keyhole slot 202 of the mounting 204.

In FIG. 6, the ledge 56 of the error proofing cap assembly 50 has unmated from the top mounting foot 174 of the electronic module 102. The ledge 56 then contracts to its original shape. The annular ring 54 is located at a position below the electronic module 102 and above the mounting 204 and is engaging a portion of the shelf 107. The large end 106 of the pre-attached fastener 104 is located below the mounting 204. The head 120 of the pre-attached fastener 104 is exposed and available for fastening.

FIG. 7A shows a perspective view of an alternative preferred embodiment of the error proofing cap assembly 50. This error proofing assembly cap 50 additionally has a back snap 71.

FIG. 7B is a bottom view of the error proofing cap assembly 50 of FIG. 7A engaged within the keyhole slot 202 of the mounting 204. The error proofing cap assembly 50 is engaged such that the back snap 71 is disposed below the lower side 207 of the mounting 204.

Thus, the object of the present invention is an error proofing cap assembly for securing an electronic module to a mounting. The error proofing cap assembly comprises a top portion, an annular ring having an inner periphery defining an opening, a ledge extending between the top portion and the annular ring, and at least one flange extending downward from the annular ring. The top portion is alignable with an upper portion of a pre-attached fastener disposed on the electronic module. The annular ring engages a bottom surface of the electronic module and is slidable along the bottom surface between a fastener engaging position, wherein the top portion is alignable with the upper portion of the electronic module, and a fastener unengaging position, wherein the upper portion of the pre-attached fastener is exposed, and where the annular ring is disposed between the bottom surface and a large end of the pre-attached fastener such that the error proofing cap assembly is retained in communication with the electronic module in both the fastener engaging position and the fastener unengaging positions. The ledge is mateable with a top mounting foot of the electronic module in the fastener engaging position, as it is made of a flexible material that expands to mate onto the top mounting foot. Similarly, the ledge will unmate from the top mounting foot when the error proofing cap assembly is moved from the fastener engaging position to the fastener unengaging position. The at least one flange engages a keyhole slot of the mounting when attaching the electronic module on the mounting and remains seated within the keyhole slot when the error proofing cap assembly is in the fastener engaging position or in the fastener unengaging position. In the fastener unengaging position, the upper portion of the pre-attached fastener is exposed and available for fastening the electronic module to the mounting by a socket, thus insuring that the electronic module is fully seated prior to tightening the pre-attached fastener. The mounting contacts a shelf of the pre-attached fastener, not the annular ring, when the pre-attached fastener is tightened. The error proofing cap assembly remains attached to the electronic module after the electronic module is fastened to the mounting.

From the foregoing it will be seen that there has been brought to the art a new and improved error proofing cap assembly which overcomes many problems with the prior art. One advantage of the invention is that the error proofing cap assembly is less expensive to manufacture due to the fact that it is more easily molded without arms. A second advantage of the invention is that the error proofing cap assembly is less likely to break during installation on the electronic module or attachment to a mounting due the fact that these protruding arms of the error proofing cap assembly are no longer present. A third advantage is that an error proofing cap assembly cannot easily be removed prior to and during attachment of an electronic module on a mounting. A fourth advantage is that the cost to manufacture an electronic module is reduced, as the electronic module is molded without the use of side recesses, which hold the protruding arms of the error proofing cap assembly in place on the electronic module and add to the cost.

While preferred embodiments of the invention have been shown, it will be understood, of course, that the invention is not limited thereto since modifications may be made by those skilled in the art, particularly in light of the following teachings. It is therefore contemplated by the appended claims to cover any such modifications as incorporate those features that constitute the essential features of these improvements within the true spirit and scope of the invention.

What is claimed is:

1. An error proofing cap assembly for securing an electronic module to a mounting comprising:
a top portion that is alignable with an upper portion of a pre-attached fastener disposed on the electronic module;
an annular ring having an inner periphery defining an opening, said annular ring engaging a bottom surface of the electronic module and slidable along said bottom surface between a fastener engaging position, wherein said top portion is alignable with said upper portion of the electronic module, and a fastener unengaging position, wherein said upper portion of said pre-attached fastener is exposed, said annular ring being disposed between said bottom surface and a large end of said pre-attached fastener such that said error proofing cap assembly is retained in communication with the electronic module in both said fastener engaging position and said fastener unengaging positions;
a ledge extending between said top portion and said annular ring, said ledge being mateable with a top mounting foot of the electronic module and;
at least one flange extending downward from said annular ring for engaging a keyhole slot of the mounting when attaching the electronic module on the mounting.

2. An error proofing cap assembly for securing an electronic module to a mounting according to claim 1, wherein the error proofing cap assembly has a back snap that engages a lower surface of said mounting when said error proofing assembly cap is seated on said mounting in a fastener engaging position or a fastener unengaging position.

3. An error proofing cap assembly for securing an electronic module to a mounting according to claim 1, wherein the error proofing cap assembly is composed of a polymer.

4. An error proofing cap assembly for securing an electronic module to a mounting according to claim 3, wherein said polymer is flexible.

5. An error proofing cap assembly for securing an electronic module to a mounting according to claim 1, wherein the error proofing cap assembly is used in a vehicle.

6. An error proofing cap assembly for securing an electronic module to a mounting according to claim 1, wherein the error proofing assembly cap is attached to the electronic module that is part of an air bag system.

7. An error proofing cap assembly for securing an electronic module to a mounting according to claim 1, wherein the pre-attached fastener has a shelf, the thickness of said shelf being greater than the thickness of the annular ring such that the mounting substantially contacts said shelf upon tightening of the pre-attached fastener.

8. An improved error proofing cap assembly comprising:
a top portion for protecting a pre-attached fastener of an electronic module;
an annular ring for engaging said electronic module and said pre-attached fastener, said annular ring having an opening;
a ledge extending from said top portion to said annular ring for attaching to a top mounting foot of said electronic module and;
at least one flange extending downward from said annular ring for engaging within a keyhole slot of a mounting when attaching said electronic module to said mounting.

9. An error proofing cap assembly for securing an electronic module to a mounting according to claim 8, wherein the error proofing cap assembly has a back snap that engages a lower surface of said mounting when said error proofing assembly cap is seated on said mounting in both a fastener engaging position and a fastener unengaging position.

10. An error proofing cap assembly for securing an electronic module to a mounting according to claim 8, wherein said error proofing assembly cap is composed of a polymer.

11. An error proofing cap assembly for securing an electronic module to a mounting according to claim 8, where said polymer is flexible.

12. An error proofing cap assembly for securing an electronic module to a mounting according to claim 8, wherein the error proofing cap assembly is used in a vehicle.

13. An error proofing cap assembly for securing an electronic module to a mounting according to claim 8, wherein the error proofing assembly cap is attached to the electronic module that is part of an air bag system.

14. An error proofing cap assembly for securing an electronic module to a mounting according to claim 8, wherein the pre-attached fastener has a shelf, the thickness of said shelf being greater than the thickness of the annular ring such that the mounting substantially contacts said shelf upon tightening of the pre-attached fastener.

15. A method of fastening an electronic module having a pre-attached fastener to a mounting, said method comprising the steps of:

attaching an error proofing cap assembly having an annular ring to the electronic module, said error proofing cap assembly being moveable between a fastener engaging position and a fastener unengaging position, where said annular ring is disposed between a large end of the pre-attached fastener and a bottom surface of the electronic module such that said error proofing cap assembly is retained in communication with the electronic module in both the fastener engaging position and the fastener unengaging positions;

positioning the error proofing cap assembly in the fastener engaging position such that the error proofing cap assembly covers the pre-attached fastener thereby protecting the pre-attached fastener prior to attaching the electronic module to the mounting;

seating the electronic module on a mounting such that at least one flange of said error proofing cap assembly is engaged to a keyhole slot of the mounting;

positioning the error proofing cap assembly in the fastener unengaging position such that said at least one flange of the error proofing cap assembly is engaged within said keyhole slot of the mounting and such that a head of the pre-attached fastener is exposed; and fastening the pre-attached fastener to the mounting.

16. A method according to claim 15, wherein the step of positioning the error proofing cap assembly in the fastener engaging position comprises mating a ledge of the error proofing cap assembly onto a top mounting foot of the electronic module containing the pre-attached fastener.

17. A method according to claim 15, wherein step of positioning the error proofing cap in the fastener unengaging position comprises unmating a ledge of the error proofing cap assembly from a top mounting foot and engaging said at least one flange from the error proofing cap assembly into said keyhole slot of the mounting.

18. A method according to claim 15, wherein the step of fastening the pre-attached fastener to the mounting comprises tightening the pre-attached fastener so that the mounting contacts a shelf of said pre-attached fastener.

* * * * *